United States Patent [19]
Horninger

[11] 3,936,811
[45] Feb. 3, 1976

[54] ASSOCIATIVE STORAGE CIRCUIT
[75] Inventor: Karlheinrich Horninger, Eglharting, Germany
[73] Assignee: Siemens Aktiengesellschaft, Berlin & Munich, Germany
[22] Filed: Sept. 24, 1974
[21] Appl. No.: 508,807

[30] Foreign Application Priority Data
Sept. 24, 1973  Germany........................... 23479687

[52] U.S. Cl. ..................... 340/173 AM; 340/173 R; 340/173 FF
[51] Int. Cl.² ......................................... G11C 11/40
[58] Field of Search.... 340/173 R, 173 FF, 173 AM

[56] References Cited
UNITED STATES PATENTS
3,573,756  4/1971  Hillis ........................... 340/173 AM
3,713,115  1/1973  Duben ......................... 340/173 AM

*Primary Examiner*—Terrell W. Fears
*Attorney, Agent, or Firm*—Hill, Gross, Simpson, Van Santen, Steadman, Chiara & Simpson

[57] ABSTRACT

An associative storage circuit characterized in that a storage cell therefor includes two circuit arms in parallel, each arm having one MNOS storage transistor and one switching transitor connected in series, and that the information which is to be written in, and the comparison information during readout, may be applied to the gates of the switching transistors, the storage transistors in one embodiment having a common gate line; in a second embodiment having individual gate controls for bit-by-bit write-in of information; and in a third embodiment, having a common gate line and a common substrate terminal line with bit-by-bit write-in by means of opposite polarity write-in potentials.

10 Claims, 3 Drawing Figures

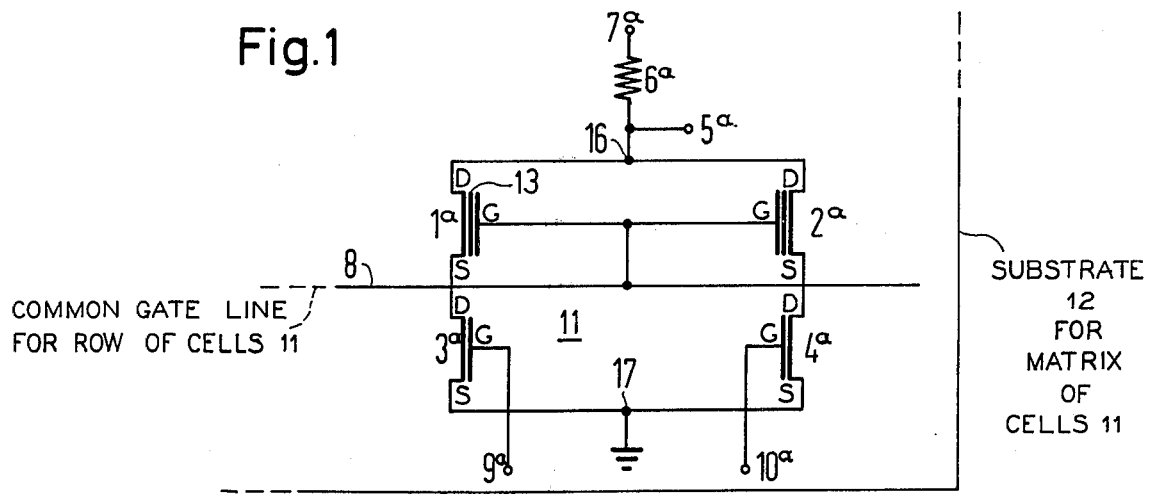
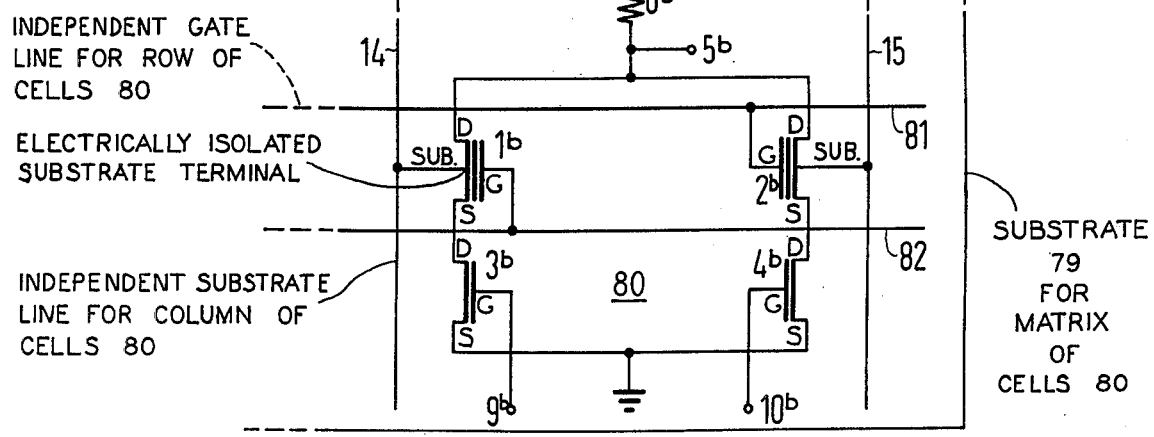
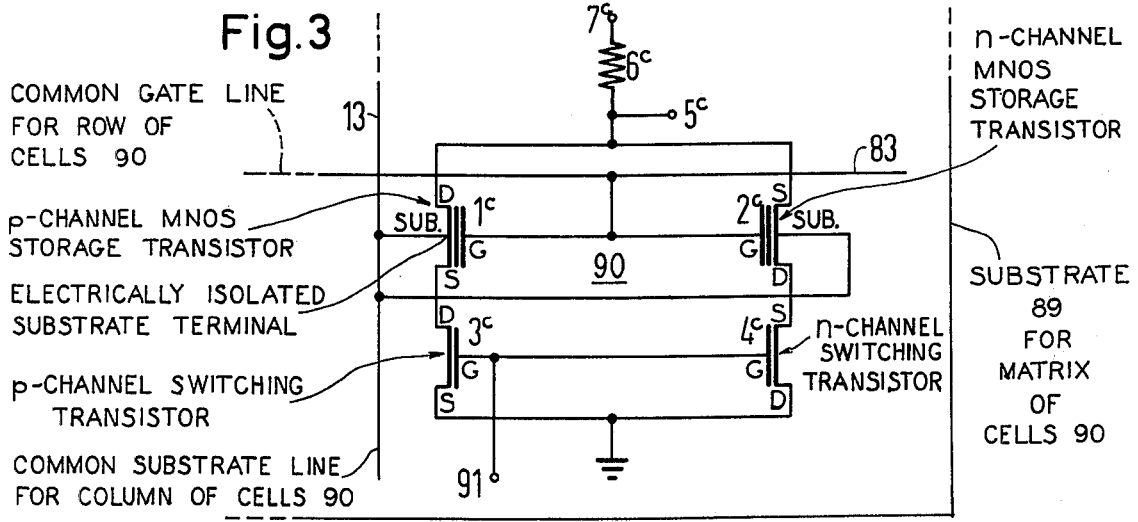

ASSOCIATIVE STORAGE CIRCUIT

BACKGROUND OF THE INVENTION

By way of background, the following disclosures are incorporated herein by reference.

1. U.S. Ser. No. 282,382 filed Aug. 21, 1972 "Associative Memory", showing an associative memory organization.
2. U.S. Ser. No. 397,402 filed Sept. 14, 1973 "Process for the Production of High Value Ohmic Load Resistors and MOS Transistors Having a Low Starting Voltage", explaining the production of load resistors and switching transistors.
3. U.S. Ser. No. 398,397 filed Sept. 18, 1973 "MNOS Transistor and Utilization Thereof in Electric Circuits", explaining MNOS storage transistors.

Each of the foregoing applications is assigned to the assignee of the present application.

SUMMARY OF THE INVENTION

This invention relates to an associative storage circuit.

An aim of the invention consists in providing an associative storage circuit with the aid of which the information stored in the elements thereof can be compared with an item of information applied from the exterior, and the indentity or non-identity of the two items of information can be established.

This aim is realized by an associative storage circuit characterized in that each storage cell thereof comprises two circuit arms each provided with one MNOS storage transistor and one switching transistor connected in series, the two arms being connected in parallel with a supply voltage source connected across the common nodes of the arms. To effect a write-in of new information into the storage cell, write-in potentials are supplied to the gates of the storage transistors such that the storage transistors exhibit respective different threshold conditions, and thereby to represent the stored information and the complement of the stored information. Comparison information may be applied to the gates of the switching transistors so as to produce an output from the storage cell in accordance with the identity or lack of identity of the applied comparison information with the logical condition of the storage cell.

An advantage of an associative storage circuit in accordance with the invention consists in that when an item of information has been written into the storage transistors of a storage cell of the storage circuit, a virtually arbitrary number of readout and comparison operations can be effected at the speed of conventional MOS circuits.

However, it is advantageously possible to erase the old information with the aid of suitable voltage pulses and to write-in a new item of information into the storage cell.

A further fundamental advantage of an associative storage circuit in accordance with the invention consists in that even in the event of the breakdown of the supply voltage, the stored information is not lost. Therefore, associative storage circuits of the invention can advantageously be used for the construction of data card indexes, in which no buffer batteries are provided for supplying operating power during a supply voltage breakdown.

Other objects, features and advantages of the invention, its organization, construction and operation will be best understood from the following detailed description of certain preferred exemplary embodiments thereof taken in connection with the accompanying drawings.

BRIEF DESCRIPTION OF THE DRAWINGS

FIG. 1 schematically illustrates an associative storage arrangement in accordance with the present invention wherein each storage cell contains two storage transistors and two switching transistors all of the same channel conductivity type, that is all p-channel field effect transistors or all n-channel field effect transistors;

FIG. 2 schematically illustrates a storage circuit in accordance with the invention wherein the storage transistors are provided with electrically isolated substrate zones; and FIG. 3 schematically illustrates a storage circuit in accordance with the invention wherein the storage transistors and switching transistors of each storage cell are constructed by a complementary MOS technique.

DETAILED DESCRIPTION OF THE PREFERRED EMBODIMENTS

The following considerations led to the invention. On account of relatively long times (10 to 50 microseconds) and high voltages (plus or minus 35 volts) which are required to write items of information into MNOS transistors, MNOS stores are particularly suitable for fixed word stores which can be electrically reprogrammed, and whose information is to be written in only a few times, but is to be read out many times. The use of MNOS storage transistors means that the information is retained even in the event of the breakdown of the supply voltage.

In associative stores featuring semiconductor elements, frequently an operation similar to that in fixed word stores which can be reprogrammed is desired. In this case the information is written in once and is then compared with other items of information applied from the exterior. If the item of information stored in the associative store and the item of information applied from the exterior are identical, this is indicated at an output of the storage circuit. Generally a write-in process will be followed by a number of read-out processes or comparison processes. In such a store it can be desirable for the information to continue to be stored even in the event of a breakdown in the supply voltage.

In FIG. 1, the MNOS transistors are designated by reference characters 1a and 2a and the switching transistors are designated 3a and 4a. In each case one MNOS transistor is connected in series with one switching transistor to form a circuit arm. For example the MNOS transistor 1a is connected in series with the switching transistor 3a, and the MNOS transistor 2a is connected in series with the switching transistor 4a to form a storage cell 11. The supply voltage $U_{DD}$ is connected between circuit points 7a and 17. Preferably the point 17 carries ground potential while point 7a may receive minus 20 volts relative to point 17. The output from the storage cell 11 may be taken between output circuit points 16 and 17, the output of the storage cell 11 being designated by reference character 5a. As shown in FIG. 1, the two circuit arms of memory cell 11 are connected in parallel between the output circuit points 16 and 17. Between output circuit point 16 and circuit point 7a is preferably arranged the resistor 6a, having a relatively large resistance value in comparison to the circuit arms in their conductive mode, but having a relatively low resistance in comparison to the resistance of the circuit arms in their non-conducting mode.

The two MNOS transistors each have a variable threshold voltage. In particular, the storage transistors 1a and 2a are responsive to respective write-in potentials available from the storage circuit to assume respective first and second threshold conditions. The write-in operations are performed such that one storage transistor has a threshold condition representing the information to be stored and the other storage transistor has the other threshold condition so as to represent the complement of the information being stored in the storage cell 11. The transistors 3a and 4a are conventional switching transistors, preferably field effect transistors. The information to be stored during a write-in operation and the comparison information to be considered during a readout operation are applied to the gate line 9a and the complement of this information is applied to gate line 10a of the switching transistors 3a and 4a, respectively. The gates of the storage transistors 1a and 2a may be commonly operated by means of a gate line 8. At the output 5a of the storage cell a logical signal is present in accordance with whether the comparison information which is applied to the gate terminals 9a and 10a of the switching transistors 3a and 4a is identical to the information stored in the storage transistors 1a and 2a, or not.

There now follows a brief description of the write-in process for an associative storage circuit such as illustrated in FIG. 1 where the successive memory cells such as 11 are formed on a common n-type semiconductive body by means of the p-channel technique. In this example, therefore, all of the transistors of each memory cell 11 are of the same channel conductivity type, namely the p-channel type. In the erased state of the storage cell, both storage transistors 1a and 2a will have a first threshold condition, for example each storage transistor may have a threshold voltage $U_{T0}$ of approximately minus 2 volts.

If now, for example, the information "one" is to be written into the cell 11 of the associative storage circuit of FIG. 1, a negative pulse is applied to the gate line 9a of switching transistor 3a, this negative pulse representing the information "one" (logical one). At the same time a high, negative write-in pulse is applied to the gates of the storage transistors 1a and 2a via the gate line 8. With the remote surface of the substrate 12 at ground potential, the application of the high negative write-in pulse to the gate of the storage transistor 1a produces an inversion layer at which minority carriers (holes) accumulate. Since the switching transistor 3a has been switched to the conductive state, the inversion layer formed in the storage transistor 1a will be connected to ground potential at circuit point 17 through the conductive channel of switching transistor 3a. The full negative write-in voltage can thus be formed across the gate insulator (indicated diagrammatically at 13 in FIG. 1) of the MNOS storage transistor 1a, and accordingly the threshold voltage of this storage transistor is displaced to a second threshold condition representing a stored logical one. For example, the storage transistor 1a may now have a threshold voltage $U_{T1}$ of approximately minus 12 volts. Since a ground potential may be supplied to gate 10a of switching transistor 4a, this transistor will be in the nonconductive state, and the inversion layer of storage transistor 2a is thus connected via the resistor 6a to supply circuit point 7a, so that the inversion layer will be approximately at the potential of the supply voltage $U_{DD}$, that is for example at approximately minus 20 volts. The resultant voltage across the gate insulator of storage transistor 2a is then not sufficient to displace the threshold voltage. The storage transistor 2a thus retains the threshold voltage $U_{T0}$. Thus the complement of the information to be stored is represented by the threshold condition of the storage transistor 2a.

If on the other hand the information logical zero is to be written into the storage cell 11 of FIG. 1, then while the high negative write-in pulse is applied to gate line 8, the switching transistor 3a is blocked via its gate terminal 9a, and the switching transistor 4a is switched to its conductive state by means of its gate terminal 10a.

The comparison process during read-out operation may be understood with the aid of the following truth table where the logical signals supplied to individual inputs 9a and 10a are designated "Zero" and "One", while the pattern of such logical input signals, considered from the standpoint of the operation of the storage cell as a whole, are termed Logical ZERO and Logical ONE.

TRUTH TABLE SHOWING
THE OPERATION OF FIG. 1
AS AN ASSOCIATIVE
STORAGE CIRCUIT

| ASSOCIATIVE INPUT | | STORED VALUE | | READOUT VALUE |
|---|---|---|---|---|
| Input 9a | Input 10a | 1a | 2a | Output 5a |
| Zero (Logical | One ZERO) | Zero (Logical | One ZERO) | One (IDENTITY) |
| One (Logical | Zero ONE) | Zero (Logical | One ZERO) | Zero (NON-IDENTITY) |
| Zero (Logical | One ZERO) | One (Logical | Zero ONE) | Zero (NON-IDENTITY) |
| One (Logical | Zero ONE) | One (Logical | Zero ONE) | One (IDENTITY) |

Referring to the preceding Truth Table, an individual Zero input signal to the input 9a or 10a may be a signal such as to leave the associated switching transistor in the nonconducting condition. Conversely, a One input signal may be such as to place the switching transistor in the conducting state. With respect to the storage transistors 1a and 2a, a "Zero" condition may be the threshold condition where the storage transistor exhibits a threshold voltage $U_{T0}$, while the "ONE""One"condition of the individual storage transistor may represent the $U_{T1}$ threshold condition of the switching transistor. Then, with respect to the output 5a of FIG. 1, a "One" output may represent an ouput of approximately the supply voltage, that is $U_{DD}$, while the "Zero" output level may correspond substantially to an output of zero volts.

Referring to the preceding Truth Table, if the storage cell 11 is in the Logical ZERO condition, and the comparison information supplied to the interrogation lines or gate lines 9a and 10a is to represent an associative input of Logical ZERO, then the switching transistor 4a is conductive. If a readout pulse having a readout voltage $U_L$ is supplied to the gate line 8 with such readout voltage corresponding to the mean value of the threshold voltages $U_{T0}$ and $U_{T1}$, then only transistor 1a having the threshold condition $U_{T0}$ will be conductive, whereas the transistor 2a will be nonconductive. Thus with a Logical ZERO associative input and a Logical ZERO stored value, the output 5a of the storage cell 11 will remain at the potential of the supply voltage $U_{DD}$, thus representing an IDENTITY SIGNAL. If, on the other hand, a Logical ONE associative input is applied from the exterior via interrogation lines 9a and 10a, but a Logical ZERO has been written into the storage cell 11, the transistors 1a and 3a will be conductive, so that the output potential at output 5a drops toward zero volts (NON-IDENTITY).

If a Logical ONE is stored in the storage cell 11, and a Logical ZERO is applied from the exterior via the interrogation lines 9a and 10a, then the transistors 2a and 4a are conductive, and the output potential at the output 5a again drops toward zero volts (NON-IDENTITY).

If, finally, a written-in Logical ONE is compared with a Logical ONE which has been applied to the interrogation lines 9a and 10a from the exterior, the transistors 2a and 3a are conductive, and the potential of the output 5a again remains at the supply potential $U_{DD}$ (IDENTITY).

As can be seen from the preceding Truth Table, a clear differentiation between IDENTITY and NON-IDENTITY of information is possible with the storage circuit of FIG. 1.

If the written information is only to be read out, a readout voltage of the aforementioned mean value may be connected to the lines 8 and 9a, while the terminal 10a is maintained at ground potential. In this event, if a Logical ZERO is stored in the storage cell, the output 5a will drop toward ground potential to indicate a stored value of Logical ZERO. On the other hand, if the storage transistor 1a has a Logical One threshold condition, that is a threshold value of $U_{T1}$, then the application of the mean readout voltage to lines 8 and 9a will not place storage transistor 1a in the conductive state, and the output 5a will remain substantially at the supply potential $U_{DD}$.

In the associative storage circuit of FIG. 1, the information is written in not bit-by-bit but word-by-word. This means that when the associative storage cells 11 of FIG. 1 are arranged in a storage matrix on the substrate 12, it is necessary to erase the entire row of storage cells associated with the common gate line 8 prior to each write-in process.

In the associative storage circuit of FIG. 2, the information can be written in bit-by-bit. This is achieved in that the storage transistors 1b and 2b possess substrate terminals isolated from each other.

Details of FIG. 2 which have already been described with reference to FIG. 1 are indicated by the use of corresponding reference numerals in FIG. 2 with the letter suffix b instead of a. The storage circuit shown in FIG. 2 is preferably constructed in a technology featuring isolating diffusions or in a ESFI technique. Here the ESFI technique is understood as a technique in which silicon layers which are of insular formation and are electrically isolated from one another are arranged on an electrically insulating substrate such as diagrammatically indicated at 79. Alternatively, reference numeral 79 may designate a semiconductor substrate with the substrate terminals of transistors 1b and 2b being electrically isolated by means of isolating diffusions.

Where the substrate 79 is of electrically insulating material, the transistors 1b, 2b, 3b and 4b are arranged in the respective insular silicon layers of a memory cell 80. The MNOS storage transistor 1b has its gate connected with a gate line 82 for a row of storage cells on the substrate 79, while the MNOS storage transistor 2b has its gate connected with a gate line 81 associated with a row of storage cells 80 on the substrate 79. The electrically isolated substrate terminal of storage transistor 1b is connected to a substrate line 14 common to a columnar series of storage cells 80 on the substrate 79, while the electrically isolated substrate terminal of storage transistor 2b is connected with substrate line 15 which is likewise common to the columnar series of storage elements 80 on the substrate 79. The input of information and the comparison of an item of information applied to the interrogation means 9b and 10b in the associative storage circuit of FIG. 2 is carried out fundamentally as in the case of the storage circuit of FIG. 1. The write-in of the information into the storage transistors 1b and 2b is however carried out in a coincidence operation. This means that during write-in, the write-in potentials must be simultaneously applied to the gate terminal and to the substrate terminal of the storage transistor whose threshold condition is to be changed. If, for example, information is to be written into the storage transistor 1b, the write-in voltage must be simultaneously connected to the gate line 82 and the substrate 14.

In the associative storage circuit represented in FIG. 3, information can again be written in bit-by-bit, but in comparison to the storage circuit shown in FIG. 2, only one gate line 83 is required for the operation of the storage transistors 1c and 2c. Details of FIG. 3 which have already been described in association with FIGS. 1 and 2 bear corresponding reference numerals followed by the letter suffix c. The MNOS storage transistors 1c and 2c of the storage circuit are complementary to one another. For example, the transistors 1c and 3c may be p-channel transistors, and the transistors 2c and 4c may be n-channel transistors. When a negative write-in pulse is applied to the p-channel storage transistor 1c, the threshold voltage is displaced into the negative range. The transistor 1c is of the enhancement type. The same pulse across the n-channel transistor 2c also displaces the threshold voltage into the negative range. The transistor 2c, however, is now of the depletion type which means that it is conductive at a gate voltage of zero volts. When a positive write-in pulse is applied to gate line 83 relative to substrate line 13, the opposite effect may be achieved. Then both transistors 1c and 2c have a positive threshold voltage, the p-channel transistor 1c being of the depletion type and the n-channel transistor 2c being of the enhancement type.

For bit-by-bit write-in, the write-in voltage must again, as in the case of the circuit shown in FIG. 2, simultaneously be connected to the gate terminal and the substrate terminal of the storage transistor whose threshold condition is to be switched. As, however, the MNOS storage transistors are complementary to one another, on account of the above-described effect only one common gate line 83 and one common substrate line 13 are required for the write-in of the information into the storage transistors. During readout, both the substrate line 13 and the gate line 83 remain at zero volts while the interrogation line 91 receives the comparison Logical signal which is to control the output from the storage cell. With the gates of both of the storage transistors 1c and 2c at zero volts, then always one of the two transistors 1c and 2c is in the conductive state. By way of example, the Logical ZERO storage condition may be represented when storage transistor 1c is conductive for a gate voltage of zero volts, while a Logical ONE signal at gate 91 may produce conduction of the switching transistor 3 c while the switching transistor 4c remains nonconductive. The readout and comparison operation for the circuit of FIG. 3 may take place similarly as in the case of the storage circuit shown in FIG. 1.

In the storage circuit in accordance with FIG. 3, a storage cell is designated by reference numeral 90, and a substrate is diagrammatically indicated at 89 for carrying a matrix of such storage cells 90.

In the storage circuit shown in FIG. 3, the number of gate and substrate lines and the area of the storage cell is advantageously reduced.

The following Truth Table will summarize the operation of FIG. 3 as an associative storage circuit.

TRUTH TABLE SHOWING THE OPERATION OF FIG. 3 AS AN ASSOCIATIVE STORAGE CIRCUIT

| ASSOCIATIVE INPUT | STORED VALUE | | READOUT VALUE |
|---|---|---|---|
| (at 91) | 1c | 2c | (at 5c) |
| ZERO (Logical ZERO) | Zero (Logical ZERO) | One | One (IDENTITY) |
| ONE (Logical ONE) | Zero (Logical ZERO) | One | Zero (NON-IDENTITY) |
| ZERO (Logical ZERO) | One (Logical ONE) | Zero | Zero (NON-IDENTITY) |
| ONE (Logical One) | One (Logical ONE) | Zero | One (IDENTITY) |

In the foregoing Truth Table, an input "zero" would be an input which would render switching transistor 4c conductive, for example an input potential of plus 10 volts, while this input would not render switching transistor 3c conductive. On the other hand, an input of One at 91 would be an input potential level for switching transistor 3c to the conducting state while switching transistor 4c would remain in the non-conducting state, for example an input potential of minus 10 volts. As previously explained, for a "Zero" stored value in a switching transistor, the switching transistor would be in the conductive state for a zero gate potential applied thereto, while for a "One" stored value, the storage transistor would be nonconducting for a zero gate potential.

The following table will show illustrative voltage conditions for writing into the storage cell 80 of FIG. 2.

TABLE SHOWING EXEMPLARY VOLTAGE CONDITIONS FOR WRITING INTO THE STORAGE CELL OF FIG. 2

| Logical ONE Substrate Line 14 | Gate Line 81 | Gate Line 82 | Substrate Line 15 |
|---|---|---|---|
| 0v. | 0v. | −40v. | 0v. |

(Switching transistor 3b conducting)

| Logical ZERO Substrate Line 14 | Gate Line 81 | Gate Line 82 | Substrate Line 15 |
|---|---|---|---|
| 0v. | −40v. | 0v. | 0v. |

(Switching transistor 4b conducting)

During the write-in of a Logical ONE into the storage cell 80, it may be advantageous to place the switching transistor 3b in a conducting state so that the inversion region of the storage transistor 1b is approximately at ground potential. Also, it is advisable to place switching transistor 4b in a nonconducting condition so that a relatively high negative potential is applied to the inversion region of storage transistor 2b in the event that gate line 81 receives a write-in potential.

Correspondingly, during writing in of a Logical ZERO into the storage cell 80, it is advantageous to place switching transistor 4b in the conducting condition and switching transistor 3b in the nonconducting condition.

The following table will summarize the exemplary voltage conditions for writing into the storage cell 90 of FIG. 3.

TABLE SHOWING EXEMPLARY VOLTAGE CONDITIONS FOR WRITING INTO THE STORAGE CELL OF FIG. 3

| Logical ONE Substrate Line 13 | Gate Line 83 | Gate Line 91 |
|---|---|---|
| 0v. | −40v. | −10v. |

(Switching transistor 3c conducting)

| Logical ZERO Substrate Line 13 | Gate Line 83 | Gate Line 91 |
|---|---|---|
| 0v. | +40v. | +10v. |

(Switching transistor 4c conducting)

Simply by way of example, in the Logical ONE condition of the storage cell 90, the storage transistor 1c, FIG. 3, may have a threshold voltage of minus 12 volts while the storage transistor 2c may have a threshold voltage of minus 3 volts, for example. In the Logical ZERO condition of storage cell 90, the storage transistor 1c may have a threshold voltage of plus 2 volts, and the storage transistor 2c may have a threshold voltage of plus 10 volts for example. It is advantageous to place switching transistor 3c in the conductive condition during the recording of a Logical ONE in storage cell 90, and to place the switching transistor 4c in the nonconductive condition. Correspondingly, in recording a Logical ZERO in the storage cell 90, it is desirable to place switching transistor 4c in the conducting condition and switching transistor 3c in the nonconducting condition. In the embodiment of FIG. 3, switching transistor 1c has respective different threshold conditions in the Logical ONE and Logical ZERO conditions of the storage cell, and similarly storage transistor 2c has respective different threshold conditions in the Logical ONE and Logical ZERO conditions of the storage cell 90, even though the Zero condition of storage cell 1c does not correspond to the One threshold condition of storage transistor 2c.

All though I have disclosed and particularly described my invention by reference to specific illustrative examples thereof, it will be apparent to those skilled in the art that many modifications and variations may be effected without departing from the spirit and scope of the novel concepts of the present invention. I therefore intend to include within the patent warranted hereon all such changes and modifications as may reasonably and properly be included within the scope of my contribution to the art.

I claim as my invention:

1. As associative storage circuit including a storage cell capable of assuming two logical conditions and comprising:

a pair of output circuit points for supplying a binary output signal representing the identity or lack of identity of an external logical comparison signal supplied to said storage cell and the logical condition of said storage cell, a pair of circuit arms connected in parallel between said output circuit points and forming said storage cell, each of said circuit arms having a storage transistor and a switching transistor in series, a supply voltage circuit connected with said output circuit points for supplying operating potentials to said transistors, said switching transistors each being controllable in accordance with an external logical comparison signal supplied thereto during a readout operation, and each being controllable in accordance with a logical information signal representing the information to be stored in said storage cell during a write-in operation, said storage transistors each having a gate including a gate insulator for providing selectively a first threshold condition and a second threshold condition of the storage transistor, and said circuit arms being responsive to write-in potentials applied to the gates of said storage transistors in conjunction with the logical information signal applied to each of said switching transistors during a write-in operation to place a corresponding one of said storage transistors in its second threshold condition while the other storage transistor exhibits its first threshold condition thereby to establish a logical condition of said storage cell in accordance with the information represented by said information signal.

2. A storage circuit in accordance with claim 1 characterized in that all of said transistors of said storage cell are of the same channel conductivity type, a common gate line being connected with the gates of both of the storage transistors of said storage cell for supplying the same write-in potential to both of said gates during a write-in operation and for supplying a common readout potential to said gates during said readout operation, said switching transistors being responsive to the logical information signal to correspondingly assume a conducting and a nonconducting condition respectively during a write-in operation so as to control the resulting logical condition of the storage cell, and said switching transistors being responsive to complementary external logical comparison signals representing comparison information to correspondingly assume a conducting and a nonconducting condition respectively during a readout operation, thereby to control the binary signal output at the output circuit points so as to represent the identity or non-identity of such external comparison information with the logical condition of said storage cell.

3. A storage circuit in accordance with claim 1 characterized in that the storage transistors of said storage cell have electrically isolated substrate terminals with respective substrate lines connected with the respective substrate terminals, said storage transistors of said storage cell having respective independent gate lines connected with the respective gates thereof, and the substrate line and gate line associated with each gate being operable to selectively apply respective first and second write-in potentials thereto to selectively establish the respective first and second threshold conditions of the associated storage transistor.

4. A storage circuit in accordance with claim 3 characterized in that a common insulating substrate has said transistors of said storage cell formed thereon at respective electrically isolated regions thereof.

5. A storage circuit in accordance with claim 3 characterized in that a common semiconductor substrate has said transistors formed thereon and electrically isolated from each other by means of isolating diffusion.

6. A storage circuit in accordance with claim 1 characterized in that the transistors of one arm of the storage cell are of a complementary channel conductivity type compared to those of the other arm, the switching transistors having respective gate electrodes connected in common for receiving and responding to said comparison signal during a readout operation to correspondingly assume a conducting and a non-conducting condition respectively, and for receiving and responding to said information signal during a write-in operation to correspondingly assume a conducting and a nonconducting condition respectively, and the storage transistors having electrically isolated substrate terminals with a common substrate line connected therewith, and a common gate line connected with said gates of said storage transistors for cooperation with the substrate line in selectively applying respective different polarity write-in potentials in common to said storage transistors of said storage cell during successive write-in operations to selectively establish the first and second threshold conditions at the respective storage transistors, thereby to selectively establish the first and second logical conditions of said storage cell.

7. An associative storage circuit including a storage cell capable of assuming two logical conditions and comprising:

a pair of output circuit points for supplying a binary output signal for representing the identity or lack of identity of an external logical comparison signal supplied to said storage cell and the logical condition of said storage cell, a pair of circuit arms connected in parallel between said output circuit points and forming said storage cell, each of said circuit arms having a storage transistor and a switching transistor in series, a supply voltage circuit connected with said output circuit points for supplying operating potentials to said transistors, said switching transistors each being controllable in accordance with an external logical comparison signal supplied thereto during a readout operation, said storage transistors each having a gate including a gate insulator for providing selectively a first threshold condition and a second threshold condition of the storage transistor, and said circuit arms being responsive to write-in potentials applied to the gates of said storage transistors in a first write-in operation to place one of said storage transistors in its first threshold condition and to place the other storage transistor in its second threshold condition thereby to represent a first logical condition of said storage cell, and in a second write-in operation to place said one storage transistor in its second threshold condition and to place said other storage transistor in its first threshold condition thereby to represent a second logical condition of said storage cell.

8. A storage circuit in accordance with claim 7 characterized in that the storage transistors of said storage cell have electrically isolated substrate terminals with respective substrate lines connected with the respective substrate terminals, said storage transistors of said storage cell having respective independent gate lines connected with the respective gates thereof, and the substrate line and gate line associated with each gate being operable to selectively apply respective first and second write-in potentials thereto to selectively establish the respective first and second threshold conditions of the associated storage transistor.

9. A storage circuit in accordance with claim 7 characterized in that the transistors of one arm of the storage cell are of a complementary channel conductivity type compared to those of the other arm, the switching transistors having respective gate electrodes connected in common and the storage transistors having electrically isolated substrate terminals with a common substrate line connected therewith, and a common gate line connected with said gates of said storage transistors for cooperation with the substrate line in selectively applying respective different polarity write-in potentials in common to said storage transistors of said storage cell during successive write-in operations to selectively establish the first and second threshold conditions at the respective storage transistors, thereby to selectively establish the first and second logical conditions of said storage cell.

10. The method of operating a storage circuit including a pair of circuit arms extending in parallel between a pair of common nodes, with a supply voltage source connected between the common nodes, and each circuit arm being provided with one storage transistor with a controllable threshold voltage and one switching transistor connected in series, said method comprising supplying logical information to be stored, during a write-in operation, to the gate electrodes of said switching transistors such as to place the switching transistor of one of the arms which is to correspond with such logical information in a conducting state and to place the switching transistor of the other arm in a nonconducting condition, applying write-in pulses to the gates of the storage transistors during said write-in operation, such that the storage transistor of the one arm has its threshold voltage changed from a first value to a second value while the storage transistor of the other arm exhibits a threshold voltage of said first value, and during a readout operation, supplying to the gate electrodes of the switching transistors respective logical comparison signals in accordance with comparison information to be compared with the information stored by said arms so as to render a one of the switching transistors conductive according the logical state represented by said logical comparison signals, and providing in conjunction with selective control of said switching transistors by means of said logical comparison signals a low impedance between said common nodes in the case of a logical NON-IDENTITY of the comparison information with the stored information, and providing a high impedance between said common nodes only in the case of a logical IDENTITY of said comparison information with said stored information.

* * * * *